United States Patent [19]
Santyr

[11] Patent Number: 5,281,917
[45] Date of Patent: Jan. 25, 1994

[54] OFF-RESONANCE SPIN-LOCKING FOR ENHANCED TUMOR CONTRAST IN NMR IMAGING

[75] Inventor: Giles E. Santyr, Monona, Wis.
[73] Assignee: Wisconsin Alumni Research Foundation, Madison, Wis.
[21] Appl. No.: 925,725
[22] Filed: Aug. 5, 1992
[51] Int. Cl.$^5$ ............................................. G01V 3/00
[52] U.S. Cl. .................................... 324/309; 324/307
[58] Field of Search ............... 324/300, 307, 309, 311, 324/312, 314

[56] References Cited

U.S. PATENT DOCUMENTS 4,876,508 10/1989 Taylor .................................. 324/309
5,001,427 3/1991 Fujiwara ............................. 324/307

OTHER PUBLICATIONS

Off Resonance field pulsing for Contrast Manipulation in MRI: Application to Human Breast Tissues, G. E. Santyr, et al., SMRM 1988, p. 1046.
Spin Locking for Magnetic Resonance Imaging with Application to Human Breast, G. E. Santyr et al., Magnetic Resonance in Medicine 12, 25–37 (1989).

Primary Examiner—Louis Arana
Attorney, Agent, or Firm—Quarles & Brady

[57] ABSTRACT

Contrast between tumor and normal fat and normal fibro-glandular breast tissues is enhanced in an NMR image by a preparatory pulse sequence executed prior to the imaging pulse sequence. An off-resonance spin-locking RF pulse is employed to enhance contrast between fibro-glandular tissue and tumors and an inversion recovery sequence is employed to enhance contrast between fat and tumors.

8 Claims, 5 Drawing Sheets

OFF-RESONANCE SPIN-LOCKING FOR ENHANCED TUMOR CONTRAST IN NMR IMAGING

BACKGROUND OF THE INVENTION

The field of the invention is nuclear magnetic resonance imaging methods and systems. More particularly, the invention relates to the enhancement of tumor contrast in NMR images.

Cancer is the leading cause of death among women aged 35 to 50 in the United States, and breast cancer is the most common malignancy in this age group. It is estimated that the average American woman run a 1 in 9 chance of developing breast cancer in her lifetime. The American Cancer Society projects that about 175,000 U.S. women will be diagnosed with breast cancer this year, and 44,500 will die from the disease. Although some controversy persists, it is generally agreed that early detection of breast cancer using X-ray mammography can significantly reduce morbidity. Unfortunately, conventional X-ray mammography often fails to detect breast cancer because of limited tissue contrast particularly in women with predominantly fibro-glandular breasts (often younger women) that are not easily penetrated by X-rays. A further draw-back of X-ray mammography is the presence of ionizing radiation which poses some health risk and is unacceptable to many patients.

Even if breast lesion is detected with X-ray mammography, it is often difficult to confirm that the lesion actually represents cancer because of overlap in mammographic appearance between malignant lesions and a variety of benign lesions including fibroadenomas, necrotic fat and post-operative scarring. Currently, surgical biopsy is the only accurate way to determine the malignant or benign basis of a mammographic finding, however many biopsies are performed on what turn out to be benign lesions. In the United States, the number of cancers diagnosed per number of surgical biopsies performed is only about 20%. This means that approximately 8 out of every 10 surgical biopsies performed on the basis of mammographic or other evidence are 'unnecessary'. Once diagnosed, effective treatment of breast cancer requires accurate localization of breast lesions in order to spare as much normal breast tissue as possible. Conventional X-ray mammography does not provide complete three-dimensional visualization of the breast and is not always sufficient to confirm the presence of multiple lesions. Clearly, alternative breast imaging methods are required in addition to X-ray mammography in order to improve detection, diagnosis and treatment of breast cancer.

Nuclear magnetic resonance (NMR) imaging is a useful adjunct to conventional X-ray mammography. NMR provides multiplanar cross-sectional images with exquisite soft tissue contrast from any view without the ionizing radiation associated with X-ray imaging.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant $\gamma$ of the nucleus). Nuclei which exhibit this phenomena are referred to herein as "spins".

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. A net magnetic moment $M_z$ produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The degree to which the net magnetic moment $M_z$ is tipped, and hence the magnitude of the net transverse magnetic moment $M_t$ depends primarily on the length of time and the magnitude of the applied excitation field $B_1$.

The practical value of this phenomenon resides in the signal which is emitted by the excited spins after the excitation signal $B_1$ is terminated. In simple systems the excited spin induce an oscillating sine wave signal in a receiving coil. The frequency of this signal is the Larmor frequency, and its initial amplitude, $A_0$, is determined by the magnitude of the transverse magnetic moment $M_t$. The amplitude, A, of the emission signal decays in an exponential fashion with time, t:

$$A = A_0 e^{-t/T^*_2}$$

The decay constant $1/T^*_2$ depends on the homogeneity of the magnetic filed and on $T_2$, which is referred to as the "spin-spin relaxation" constant, or the "transverse relaxation constant. The $T_2$ constant is inversely proportional to the exponential rate at which the aligned precession of the spins would dephase after removal of the excitation signal $B_1$ in a perfectly homogeneous field.

Another important factor which contributes to the amplitude A of the NMR signal is referred to as the spin-lattice relaxation process which is characterized by the time constant $T_1$. It describes the recovery of the net magnetic moment M to its equilibrium value along the axis of magnetic polarization (z). The $T_1$ time constant is longer than $T_2$, much longer in most substances of medical interest.

The NMR measurements of particular relevance to the present invention are called "pulsed NMR measurements." Such NMR measurements are divided into a period of RF excitation and a period of signal emission. Such measurements are performed in a cyclic manner in which the NMR measurement is repeated many times to accumulate different data during each cycle or to make the same measurement at different locations in the subject. A wide variety of preparative excitation techniques are known which involve the application of one or more RF excitation pulses ($B_1$) of varying magnitude, duration, and direction. Such excitation pulses may have a narrow frequency spectrum (selective excitation pulse), or they may have a broad frequency spectrum (nonselective excitation pulse) which produces transverse magnetization $M_t$ over a range of resonant frequencies. The prior art is replete with excitation techniques that are designed to take advantage of particular NMR phenomena and which overcome particular problems in the NMR measurement process.

When utilizing NMR to produce images, a technique is employed to obtain NMR signals from specific locations in the subject. Typically, the region which is to be imaged (region of interest) is scanned by a sequence of NMR measurement cycles which vary according to the particular localization method being used. The resulting set of received NMR signals are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) which have the same direction as the polarizing field $B_0$, but which have a gradient along the respective x, y and z axes. By controlling the strength of these gradients during each NMR cycle, the spatial distribution of spin excitation can be controlled and the location of the resulting NMR signals can be identified.

The present invention will be described in detail with reference to a variant of the well known Fourier transform (FT) imaging technique, which is frequently referred to as "spin-warp". The spin-warp technique is discussed in an article entitled "Spin Warp NMR Imaging and Applications to Human Whole-Body Imaging" by W.A. Edelstein et al., *Physics in Medicine and Biology*, Vol. 25, pp. 751-756 (1980). It employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase encoding gradient ($G_y$) along that direction, and then a spin-echo signal is acquired in the presence of a readout magnetic field gradient ($G_x$) in a direction orthogonal to the phase encoding direction. The readout gradient present during the spin-echo acquisition encodes spatial information in the orthogonal direction. In a typical 2DFT pulse sequence, the magnitude of the phase encoding gradient pulse $G_y$ is incremented ($\Delta G_y$) in the sequence of views that are acquired during the scan to produce a set of NMR data from which an entire image can be reconstructed.

Numerous strategies are employed to enhance the contrast of various tissues in medical images reconstructed from NMR data. Such strategies usually take advantage of the fact that different tissue types exhibit different $T_1$ and/or $T_2$ (and $T_2^*$) relaxation times. For example, to suppress the signal produced by fat tissues, it is common practice to precede the NMR pulse sequence with an inversion RF pulse followed by a recovery time (TI) as described by Bydder et al *JCAT* 3, 251-254 (1985). By judiciously selecting the recovery time TI, the spins in fat tissue produce little transverse magnetization in the subsequent NMR pulse sequence, and therefore, little signal in the acquired NMR data. As a result, the fat tissues appear less bright in the reconstructed image and other tissues dominate the image. Such fat suppression techniques are essential in the imaging of some organs such as the breast, which have a high fat content.

To diagnose many diseases it is necessary to provide medical images which contrast other tissue types. For example, in the imaging of the breast it is important to provide contrast between normal fibro-glandular tissue and breast tumors. This is particularly a problem in younger women with more glandular breasts on whom mammography is often inconclusive. One reason for this lack of contrast is that the $T_1$ relaxation times of fibro-glandular tissue and tumor tissue are nearly the same and this parameter cannot, therefore, be used as a contrast enhancing mechanism as with fat. Contrast agents such as Gadolinium may be injected into the subject shortly before the scan to shorten the $T_1$ of tumor cells and provide a contrast mechanism, but this is a costly, invasive procedure that cannot be used on all patients and the timing of the injection is critical if maximum contrast is to be achieved.

Spin locking is an NMR experiment in which the equilibrium magnetization established by the polarizing magnetic field is rotated by a 90° RF excitation pulse into the transverse plane and "locked" by the application of a much weaker rf field. In the rotating frame of reference and in the absence of spatial encoding gradients, spins are subject to an effective rf field $$H_{eff} = \Delta z + H_1 y, \tag{1}$$

where the resonance offset, $\Delta = H_0 - \omega/\gamma$. $H_o$ is the magnitude of the static polarizing magnetic field in the direction z, $\gamma$ is the gyromagnetic ratio, and $H_1$ is the magnitude of the rf field in the direction y as shown in FIG. 3A. If the rf field is applied on resonance ($\omega = \omega_0 = \gamma H_0$), the magnetization in the rotating frame, $M_0$, is perturbed only by the applied rf field, $H_1$. The transverse magnetization remains in phase along the direction of $H_1$ and relaxes with time constant $T_{1\rho}$. At the end of the locking interval, the magnetization relaxes as a normal free induction decay (FID) as shown in FIG. 3B. One of the difficulties in applying this experiment to an imaging scan is that the RF locking field requires high power when used with the large polarizing magnetic fields employed with NMR imaging systems. This is difficult to achieve and it exceeds the SAR limits imposed on human subjects.

The same type of experiment can also be performed off resonance ($\Delta > H_1$). During the application of the off-resonance field pulse, the equilibrium magnetization $M_0$ relaxes along the effective field $\Delta$ inclined by an angle $\theta$ to the transverse plane. The off-resonance technique measures a relaxation time, $T_{1\rho}^{off}$, which contains contributions from both the rotating frame and laboratory frame spin-lattice relaxation time, $T_{1\rho}$ and $T_1$, respectively. This technique enables $T_{1\rho}$ information to be obtained without the large rf field strengths required for spin locking on resonance. As described in articles by G.E. Santyr et al entitle "Spin Locking for Magnetic Resonance Imaging with Application to Human Breast," *Magnetic Resonance In Medicine*, 12, 25-37 (1989) and "Off Resonance Field Pulsing For Contrast Manipulation in MRI Application to Human Breast Tissues," Proceedings of the SMRM," San Francisco (1988), the $T_{1\rho}$ spin-lattice relaxation time can be used to distinguish breast tumors from other breast tissues.

SUMMARY OF THE INVENTION

The present invention is a method and means for imaging the human breast and other organs where improved contrast between tumors and other tissues is desired using an NMR imaging system. More particularly, the present invention employs a magnetization preparatory sequence prior to the NMR imaging pulse sequence in which signals produced by fat tissues are suppressed using an inversion recovery sequence and the signals produced by tissues other than tumors are suppressed by an off-resonance spin locking sequence. The inversion recovery period TI is set to suppress fat signals and the spin locking interval TSL, spin locking pulse strength ($f_1 = \gamma h_1/2\pi$) and spin locking pulse frequency offset $\Delta$ are set to suppress tissues other than tumor tissues. Any one of many different imaging pulse sequences may then be executed to acquire NMR data from which an image is reconstructed.

A general object of the invention is to enhance the contrast of tumor tissues in NMR images. This is achieved by a preparatory pulse sequence prior to the image data acquisition pulse sequence in which $T_1$ and $T_{1\rho}$ differences in tissue types are exploited to suppress signals produced by non-tumor tissues. $T_1$ differences are exploited using an inversion recovery sequence and $T_{1\rho}$ differences are exploited using an off-resonance spin-locking sequence.

Another object of the invention is to provide $T_{1\rho}$ contrast using an off-resonance spin-locking technique which does not significantly increase total scan time or apply excessive RF power to the patient. The spin-locking RF pulse may be applied after the 180° RF inversion pulse and within the interval TI required to provide the desired $T_{1\rho}$ contrast. By offsetting the frequency of the spin-locking pulse, its power can be reduced to acceptable values, even when used on high polarizing field imaging systems.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

GENERAL DESCRIPTION OF THE INVENTION

Figure 5A:
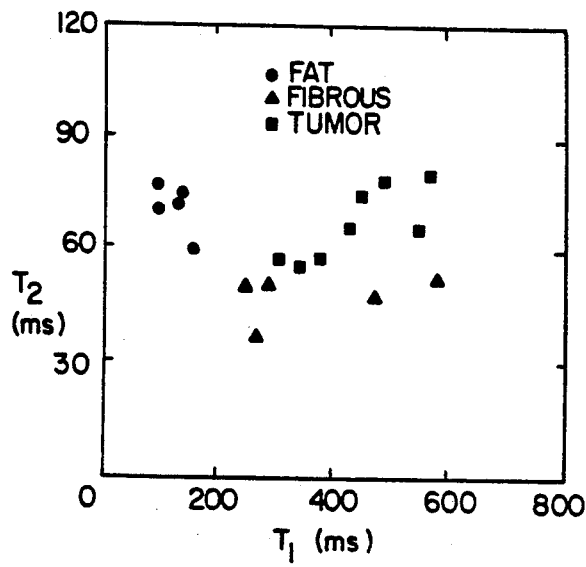
FIGS. 5A and 5B are graphic representations of the relationship between the $T_2$ and $T_1$ and $T_{1\rho}$ time constants in three types of human breast tissues.

NMR imaging is extremely useful for detecting abnormalities, such as tumors or regions of tissue damaged by stroke. Conventional NMR image contrast is provided largely by differences in spin relaxation times, $T_1$ and $T_2$. Relaxation times depend on a number of tissue-specific factors (e.g., tissue water content, biochemical properties, etc.) and appear to be very sensitive to disease processes. Conventional $T_1$-weighted spin-echo imaging provides useful anatomical information, but generally only distinguishes fat from non-fatty tissue. $T_2$-weighted spin-echo imaging can provide more contrast between non-fatty tissues but breast cancer, for example, can still be obscured by fat. In fact, no combination of conventional $T_1$ and $T_2$-weighted imaging can provide contrast of breast cancer that could not otherwise arise from some combination of normal breast tissues. Furthermore, detection of breast cancer is hampered by overlap in $T_1$ and $T_2$ with benign fibroadenomas. FIG. 5A shows $T_1$ and $T_2$ values for three breast tissue types: normal fat and fibro-glandular (fibrous) tissues and breast cancer (carcinoma). Note the overlap between fat and cancer on the $T_2$ axis and the overlap between fibro-glandular tissue and cancer on the $T_1$ axis.

Spin-locking techniques improve contrast and tissue characterization in NMR imaging by exploiting the novel relaxation time $T_{1\rho}$. Unlike conventional $T_1$ relaxation which depends on the polarizing magnetic field $B_0$, $T_{1\rho}$ relaxation depends on the much weaker RF excitation field $B_1$ and appears to provide improved contrast between some tissues. This is similar to the contrast improvement achieved with $T_1$ relaxation at very low polarizing magnetic field strengths, but spin locking is performed at high polarizing magnetic field strengths which are necessary to provide low noise images for medical applications.

Although the exact mechanisms responsible for $T_{1\rho}$ relaxation in biological tissues are unclear, magnetization transfer appears to play a significant role. Magnetization transfer is very sensitive to macromolecular tissue structure (e.g., macromolecules in membranes etc.) usually invisible to conventional NMR imaging and may be exploited to distinguish malignant from benign lesions. $T_{1\rho}$ may also be used to estimate sizes and exchange rates of mobile and immobile groups of spins in tissue which may provide additional parameters for distinguishing malignant breast lesions and may be important for understanding the microscopic processes involved in breast cancer. As well, changes in magnetization transfer may precede changes in lesion size which presumably is a much later indicator of breast cancer development.

Figure 5B:
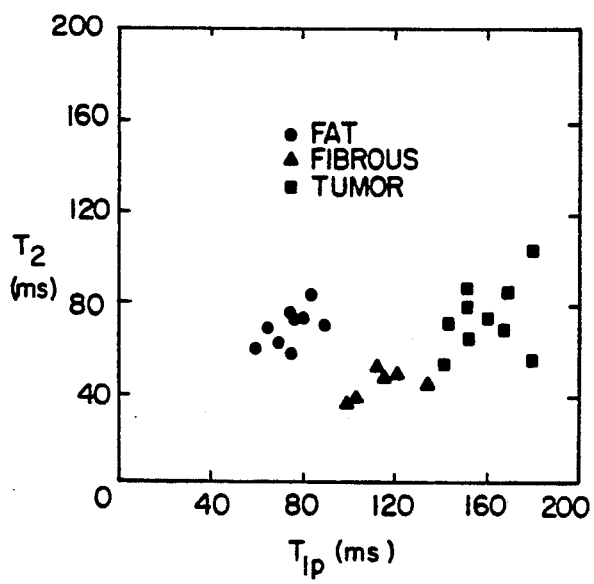

$T_{1\rho}$ has been measured in breast tissues and can be used to distinguish breast cancer (carcinoma) from fat and fibro-glandular breast tissues in vitro. FIG. 5B shows the results of $T_2$ and $T_{1\rho}(B_1 = 2.5$ gauss) measurements. Note that along the horizontal axis, $T_{1\rho}$ for cancer is longer than that for either of the normal breast tissues.

Conventional spin-locking techniques require excessive RF power when applied to conventional NMR imaging systems which employ high polarizing magnetic fields (e.g., 0.5 Tesla or greater). It has been discovered that off-resonance spin-locking techniques (also known as off-resonance field pulsing) also provide $T_{1\rho}$-weighted image contrast similar to traditional on-resonance spin locking (otherwise known in the art as $T_{1\rho}{}^{off}$, but referred to hereinafter as $T_{1\rho}$). However, by trading off $B_1$ amplitude for resonance offset $\Delta$, off-resonance spin locking requires much less RF power ($B_1 \leq 0.1$ gauss). Off-resonance spin-locking techniques can therefor be used to obtain useful $T_{1\rho}$-weighted image contrast using conventional NMR imaging systems without excessive tissue heating.

Figure 6:
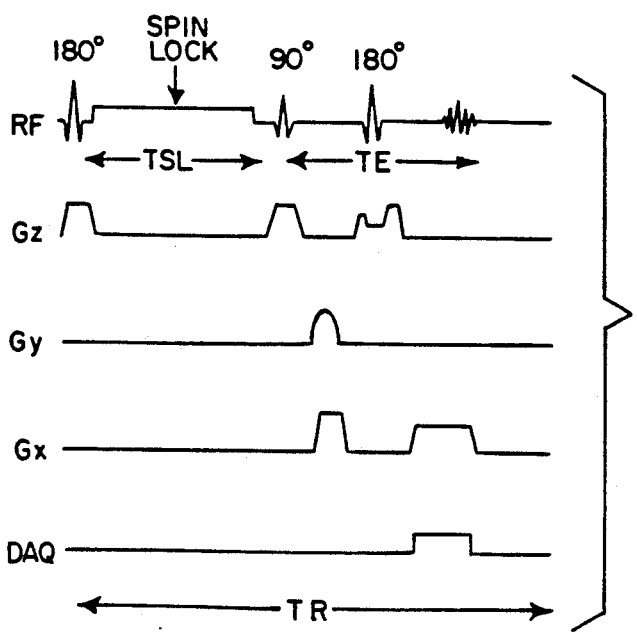
FIG. 6 is a graphic representation of a pulse sequence used to describe the present invention.

The present invention is characterized by an inversion recovery imaging sequence with the addition of a long off-resonance spin-locking pulse between the initial 180° inversion pulse and the subsequent excitation pulse in the imaging sequence as shown in FIG. 6. The spin-locking pulse is characterized by duration TSL, amplitude $B_1$ and resonance offset $\alpha$ (units of Hz). The Larmor frequency associated with the spin-lock RF field amplitude is referred to as $f_1$ ($f_1 = \gamma B_1/2\pi$, units of Hz).

During the application of the spin-locking pulse, the NMR signal evolves with time constant $T_{1\rho}$ along the 'effective' RF field $B_{eff}$ in the rotating frame of reference according to:

$$S = \alpha \exp(-t/T_{1\rho}) + \beta$$

Figure 7A:
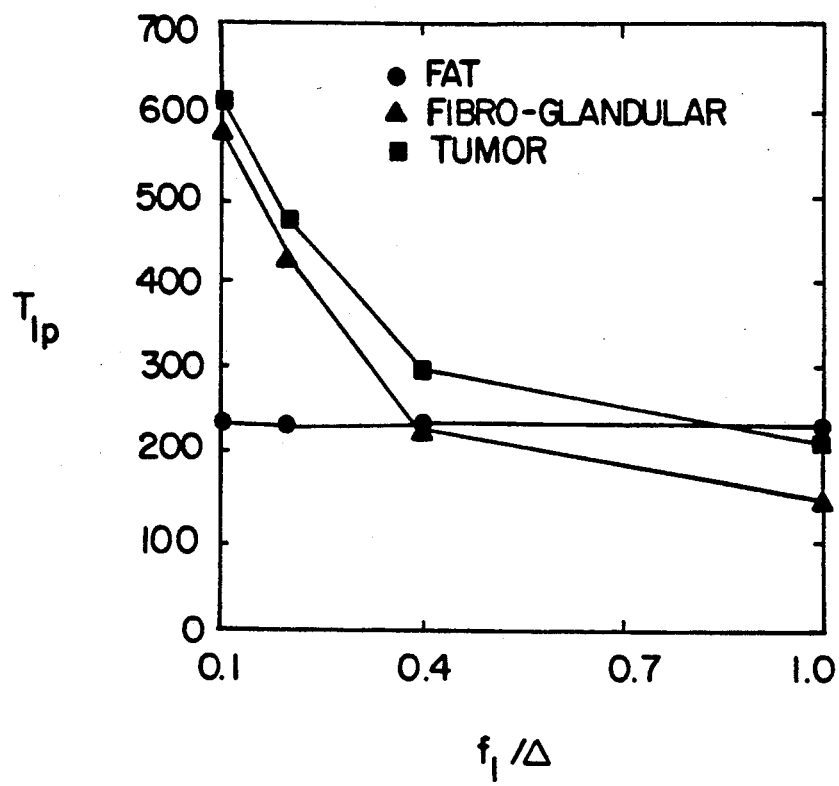
FIGS. 7A and 7B are graphic representations of the relationship between parameters employed in the pulse sequence of FIG. 6 and the three types of human breast tissue.
Figure 7B:
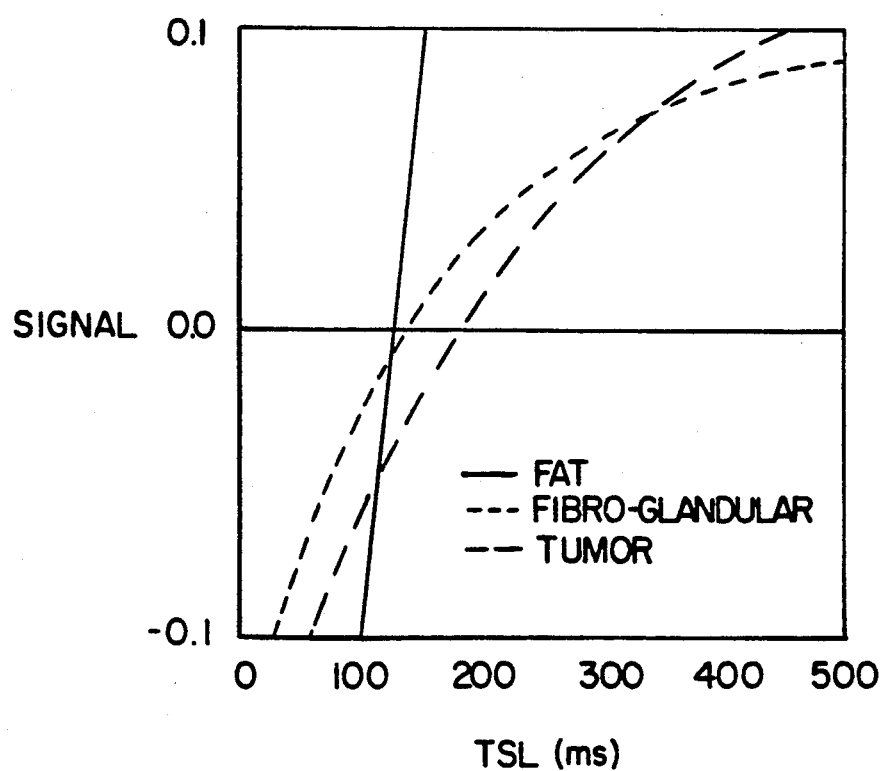

In this equation, $\alpha$ depends on $\beta$ and the repetition time of the sequence (TR) and $T_{1\rho}$ and $\beta$ depend on both properties of the spin-locking pulse ($f_1/\Delta$) and relaxation properties of the tissue ($T_1$, $T_2$ and magnetization transfer). The use of spin locking for NMR imaging of the human breast has been evaluated by measuring $T_{1\rho}$ and $\beta$ of normal breast tissues as well as an anthropomorphic breast phantom and optimizing the imaging sequence parameters $f_1/\Delta$ and TSL accordingly. FIG. 7A shows $T_{1\rho}$ values as a function of $f_1/\rho$ obtained for fat, fibro-glandular and tumor tissues of the human breast. FIG. 7B shows the longitudinal magnetization strength at the time of the echo for the same three breast tissues as a function of the length of that TSL period at $f_1/\Delta = 1.0$. These graphs show that signals from fat (solid line) and fibro-glandular tissues (dotted line) can be nulled nearly simultaneously at a TSL of approximately 120 to 130 milliseconds. The tumor tissue (dashed line) still has substantial longitudinal magnetization at this same point and the NMR signals produced by tumor tissue will therefore, be enhanced relative to the other two tissue types in the subsequent imaging pulse sequence.

DESCRIPTION OF THE PREFERRED EMBODIMENT

Figure 1:
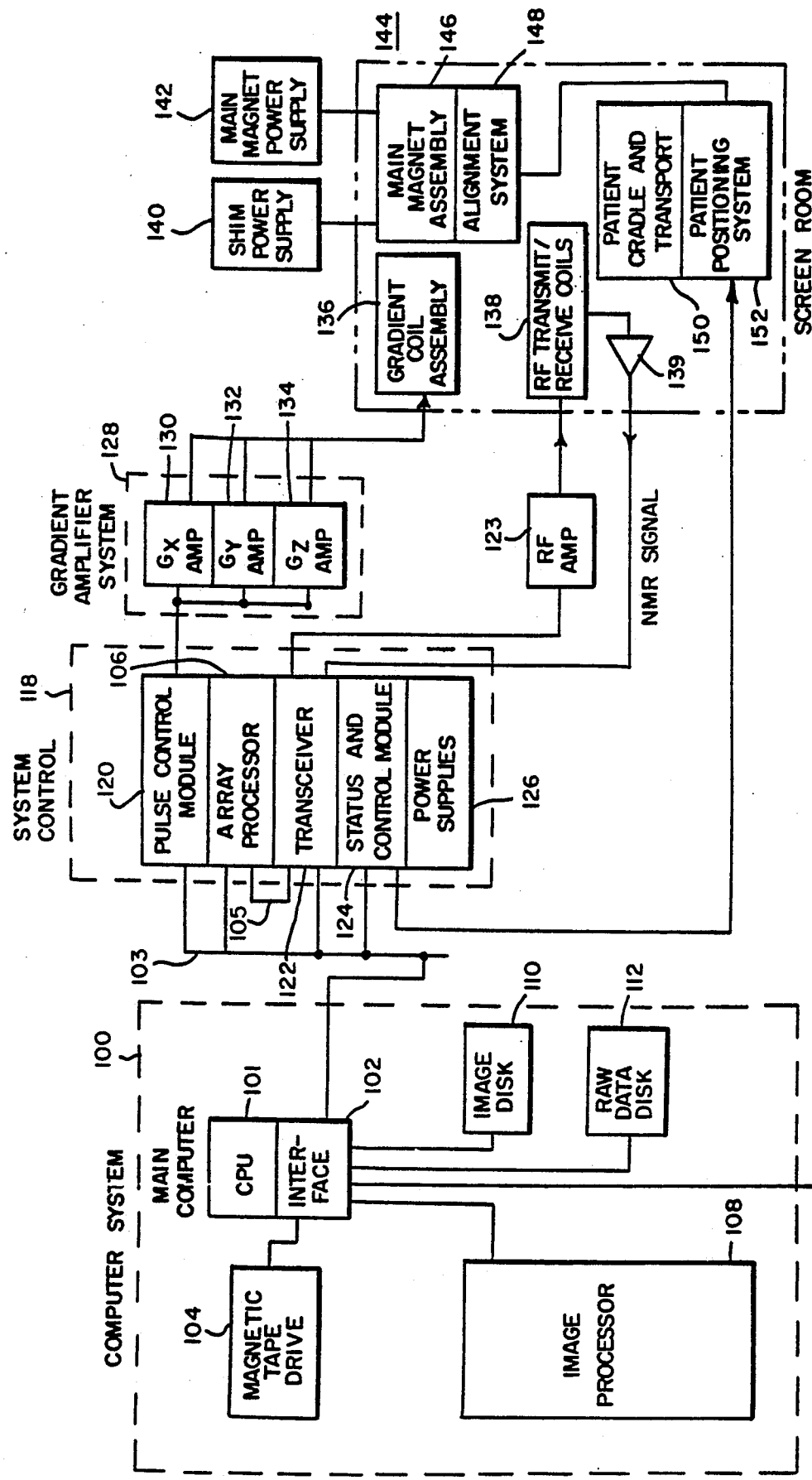
FIG. 1 is a block diagram of an NMR system which employs the present invention.

Referring first to FIG. 1, there is shown in block diagram form the major components of a preferred NMR system which incorporates the present invention and which is sold by the General Electric Company under the trademark "SIGNA". The overall operation of the system is under the control of a host computer system generally designated 100 which includes a main computer 101 (such as a Data General MV7800). The computer has associated therewith an interface 102 through which a plurality of computer peripheral devices and other NMR system components are coupled. Among the computer peripheral devices is a magnetic tape drive 104 which may be utilized under the direction of the main computer for archiving patient data and images to tape. Processed patient data may also be stored in an image disc storage device designated 110. The function of image processor 108 is to provide interactive image display manipulation such as magnification, image comparison, gray-scale adjustment and real-time data display. The computer system is provided with a means to store raw data (i.e. before image construction) utilizing a disc data storage system designated 112. An operator console 116 is also coupled to the computer by means of interface 102 and provides the operator with the means to input data pertinent to a patient study as well as additional data necessary for proper NMR system operation, such as calibrating, initiating and terminating scans. The operator console is also used to display images stored on discs or magnetic tape.

The computer system 100 exercises control over the NMR system by means of system control 118 and gradient amplifier system 128. The computer 100 communicates with system control 118 by means of a link 103 in a manner well known to those skilled in the art. The system control 118 includes several subsystems such as a pulse control module (PCM) 120, an array processor 106, a radio frequency transceiver 122, a status and control module (SCM) 124, and the power supplies generally designated 126 necessary to energize the components. The PCM 120 utilizes control signals provided by main computer 101 to generate digital timing and control signals such as the digital waveforms which control gradient coil excitation, as well as RF envelope waveforms utilized in the transceiver 122 for modulating the RF excitation pulses. The gradient waveforms are applied to the gradient amplifier system 128 generally comprised of $G_x$, $G_y$ and $G_z$ amplifiers 130, 132 and 134, respectively Each amplifier 130, 132 and 134 is utilized to excite a corresponding gradient coil in an assembly generally designated 36 and which is part of a magnet assembly 146. When energized, the gradient coils generate magnetic field gradients $G_x$, $G_y$ and $G_z$ of the magnetic field in the same direction as the main polarizing magnetic field, wherein the gradients are directed in mutually orthogonal X-, Y- and Z-axis directions of a Cartesian coordinate system. That is, if the magnetic field generated by the main magnet (not shown) is directed in the z direction and is termed $B_0$, and the total magnetic field in the z direction is referred to as $B_z$, then $G_x = \partial B_z/\partial x$, $G_y = \partial B_z/\partial y$ and $G_z = \partial B_z/\partial z$, and the magnetic field at any point (x, y, z) is given by $B(x, y, z) = B_o + G_x X + G_y Y + G_z Z$.

The gradient magnetic fields are utilized in combination with radio frequency pulses generated by transceiver 122, RF amp 128 and RF coil 138 to encode spatial information into the NMR signals emanating from the region of the patient being studied. Waveforms and control signals provided by the pulse control module 120 are utilized by the transceiver subsystem 122 for RF carrier modulation and mode control. In the transmit mode, the transmitter provides a radio frequency waveform modulated in accordance with the control signals to an RF power amplifier 123 which then energizes RF coil 138 which is situated within main magnet assembly 146. The NMR signals radiated by the excited nuclei in the patient are sensed by the same or a different RF coil than is used for transmitting and amplified by a preamplifier 139. The NMR signals are amplified, demodulated, filtered, and digitized in the receiver section of the transceiver 122. The processed NMR signals are transmitted to the array processor 106 for processing by means of a dedicated, unidirectional link 105.

The PCM 120 and SCM 124 are independent subsystems both of which communicate with main computer 101, peripheral system, such as patient positioning system 152, as well as to one another by means of serial communications link 103. The PCM 120 and SCM 124 are each comprised of a 16-bit microprocessor (such as Intel 80286) for processing commands from the main computer 101. The SCM 124 includes means for acquiring information regarding patient cradle position, and the position of the moveable patient alignment light fan beam (not shown). This information is used by main computer 101 to modify image display and reconstruction parameters. The SCM 124 also initiates functions such as actuation of the patient transport and alignment systems.

The gradient coil assembly 136 and the RF transmit and receiver coils 138 are mounted within the bore of the magnet utilized to produce the polarizing magnetic field. The magnet forms a part of the main magnet assembly which includes the patient alignment system 148. A shim power supply 140 is utilized to energize shim coil associated with the main magnet and which are used to correct inhomogeneities in the polarizing magnet field. In the case of a resistive magnet, main magnet power supply 142 is utilized to continuously energize the magnet. In the case of a superconductive magnet, the main power supply 142 is utilized to bring the polarizing field produced by the magnet to the proper operating strength and is then disconnected. In the case of a permanent magnet, power supply 142 would not be needed. The patient alignment system 148 operates in combination with a patient cradle and transport system 150 and patient positioning system 152. To minimize interference from external sources, the NMR system components comprised of the main magnet assembly, the gradient coil assembly, and the RF transmit and receiver coils, as well as the patient-handling devices, are enclosed in an RF-shielded room generally designated 144.

Figure 2:
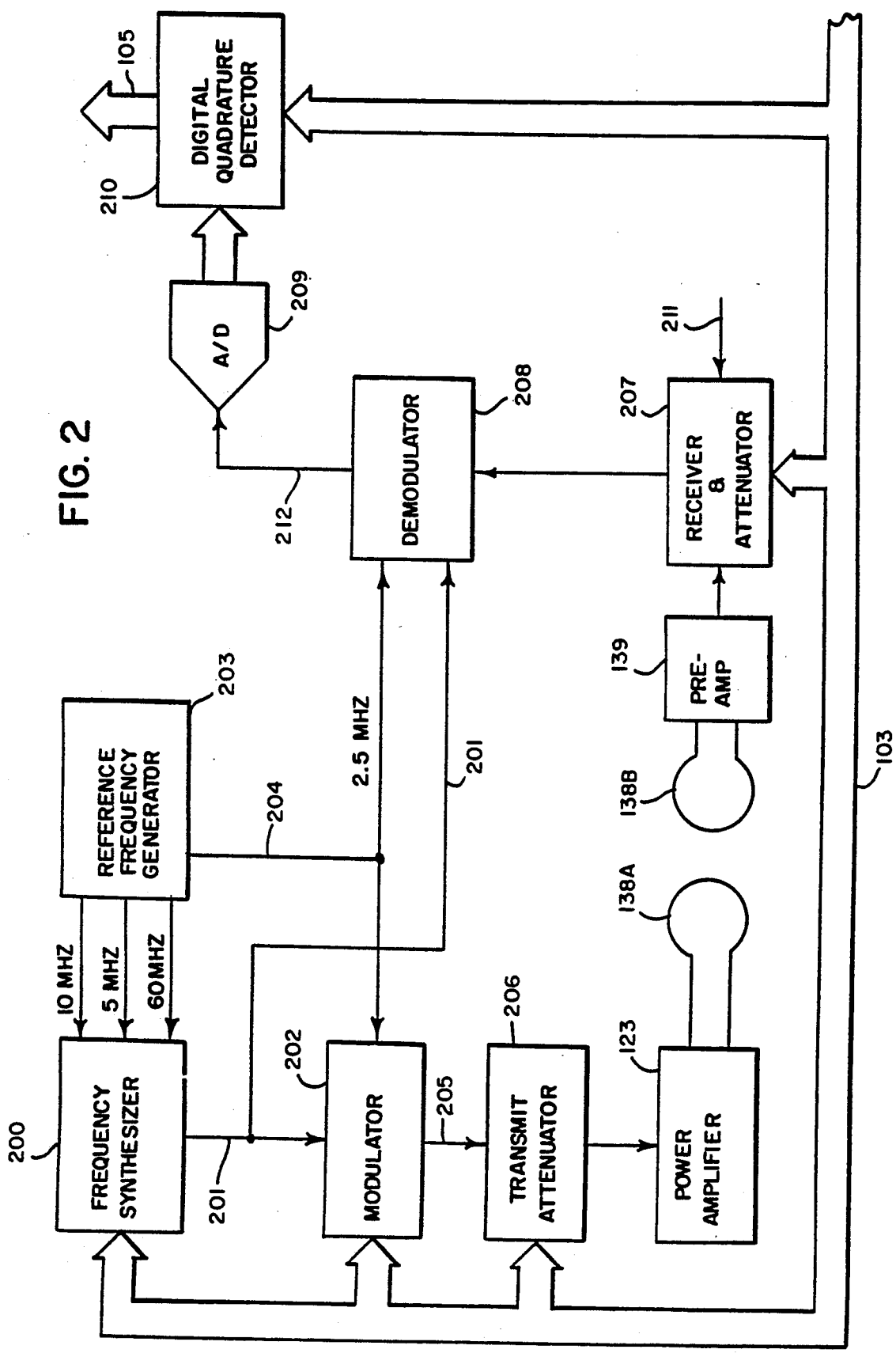
FIG. 2 is an electrical block diagram of the transceiver which forms p system of FIG. 1.
Figure 3A:
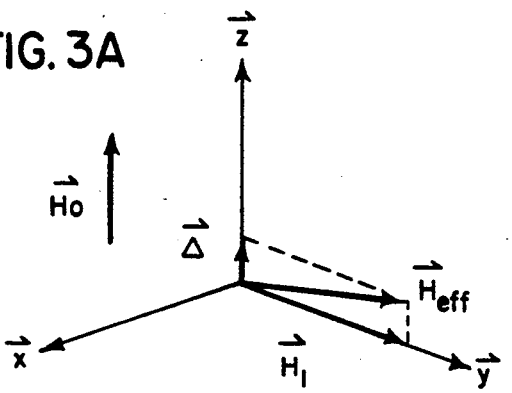
FIGS. 3A and 3B are graphic representations of an NMR spin-locking experiment.
Figure 3B:
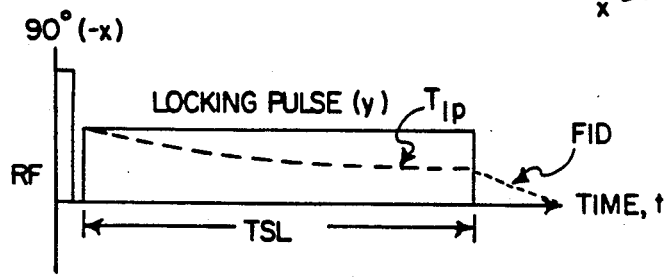

Referring particularly to FIGS. 1 and 2, the transceiver 122 includes components which produce the RF excitation field $B_1$ through power amplifier 123 at a coil 138A and components which receive the resulting NMR signal induced in a coil 138B. The base, or carrier, frequency of the RF excitation field is produced under control of a frequency synthesizer 200 which receives a set of digital signals (CF) through the communications link 103 from the main computer 101. These digital signals indicate the frequency and phase of the RF carrier signal which is produced at an output 201. The commanded RF carrier is applied to a modulator 202 where it is modulated in response to a signal R(t) received through bus 103 from the PCM 120. The signal R(t) defines the envelope, and therefore the bandwidth, of the RF excitation pulse to be produced. It is produced in the PCM 120 by sequentially reading a series of stored 16-bit digital values out of pulse shape look-up table that represent the desired envelope. These stored digital values are "played out" by a 1 MHz clock signal as the RF excitation pulse is produced, and these values may be changed by the computer 100 to enable any desired RF pulse envelope to be produced.

The magnitude of the RF excitation pulse output through line 205 is attenuated by a transmit attenuator circuit 206 which receives a digital signal, TA, from the main computer 101 through communications link 103. The attenuated RF excitation pulses are applied to the power amplifier 123 that drives the RF transmitter coil 138A. For a more detailed description of this portion of the transceiver 122, reference is made to U.S. Pat. No. 4,952,877 which issued on Aug. 28, 1990 and which is incorporated herein by reference.

Referring still to FIGS. 1 and 2 the NMR signal produced by the subject is picked up by the receiver coil 138B and applied to the input of a receiver 207. The receiver 207 amplifies the NMR signal and this is attenuated by an amount determined by a digital attenuation signal (RA) received from the main computer 101 through link 103. The receiver 207 is also turned on and off by a signal through line 211 from the PCM 120 such that the NMR signal is acquired only over the time intervals required by the particular acquisition being performed.

The received NMR signal is at or around the Larmor frequency, which in the preferred embodiment is around 63.86 MHz. This high frequency signal is demodulated in a two step process in a demodulator 208 which first mixes the NMR signal with the carrier signal on line 201 and then mixes the resulting difference signal with the 2.5 MHz reference signal on line 204. The resulting demodulated NMR signal on line 212 has a bandwidth of 125 kHz and it is centered at a frequency of 187.5 kHz. The demodulated NMR signal is applied to the input of an analog-to-digital (A/D) converter 209 which samples and digitizes the analog signal at a rate of 250 kHz. The output of the A/D converter 209 is applied to a digital quadrature detector 210 which produces 16-bit in-phase (I) values and 16-bit quadrature (Q) values corresponding to the received digital signal. The resulting stream of digitized I and Q values of the received NMR signal is output through bus 105 to the array processor 106 where they are typically employed to reconstruct an image.

To preserve the phase information contained in the received NMR signal, both the modulator 202 in the transmitter section and the demodulator 208 in the receiver section are operated with common signals. More particularly, the carrier signal at the output 201 of the frequency synthesizer 200 and the 2.5 MHz reference signal at the output 204 of the reference frequency generator 203 are employed in both the modulation and the demodulation process. Phase consistency is thus maintained and phase changes in the demodulated received NMR signal accurately indicate phase changes produced by the excited spins. The 2.5 MHz reference signal as well as 5, 10 and 60 MHz reference signals are produced by the reference frequency generator 203 from a common 10 MHz clock signal, and the latter three reference signals are employed by the frequency synthesizer 200 to produce the carrier signal on output 201. For a more detailed description of the receiver, reference is made to U.S. Pat. No. 4,992,736 which is incorporated herein by reference.

Figure 4:
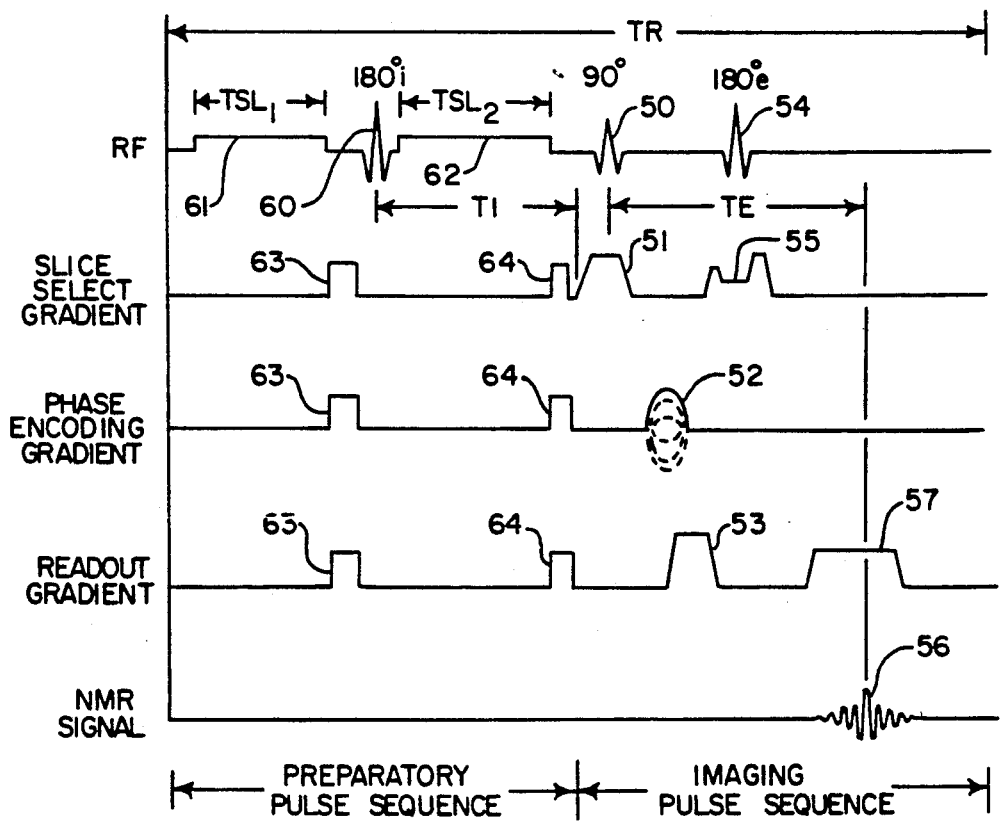
FIG. 4 is a graphic representation of the preferred embodiment of a pulse sequence executed by the NMR system of FIG. 1 to the present invention.

The preferred embodiment of the present invention is implemented with the pulse sequence of FIG. 4. This pulse sequence is comprised of two parts: a preparatory pulse sequence and an imaging pulse sequence. The imaging pulse sequence is a conventional spin-warp sequence and the preparatory pulse sequence is a combination which will be described in more detail below.

Referring to FIG. 4, the imaging pulse sequence begins with the generation of a 90° RF excitation pulse 50 which is produced in the presence of a slice select magnetic field gradient 51. A phase encoding magnetic field gradient pulse 52 is then applied, as is a readout magnetic field gradient pulse 53. A 180° RF echo pulse 54 is then applied in the presence of a second slice select gradient pulse 55 and an NMR echo signal 56 is produced and acquired thereafter in the presence of a second readout gradient pulse 57. To minimize $T_2$ effects the echo time TE is kept to a minimum, which is 16 msec in the preferred embodiment. As is well known by those skilled in the art, each NMR echo signal 56 provides data for one "view" and a scan requires that this pulse sequence be repeated many times with different amounts of phase encoding 52 applied during each acquisition. In the preferred embodiment 256 samples are acquired during each acquisition of the NMR echo signal 56 and the phase encoding 52 is stepped through 128 discrete values. At the completion of the scan, therefore, a 256 by 128 array of NMR data has been acquired and this is employed to reconstruct an image by performing a complex two-dimensional, Fourier transformation on it.

While a spin warp imaging pulse sequence is described herein, many other imaging pulse sequences can be used and will benefit from the contrast enhancement of the present invention. For example, imaging pulse sequences such as echo-planar pulse sequences (EPI) described by Peter Mansfield (*J. Phys.* c.10: L55–L58, 1977); steady-state free precession pulse sequences (SSFP, GRASS, SSFP-ECHO) described by R.C. Hawkes and S. Patz (*Magnetic Resonance In Medicine*, 4, pp. 9–23, 1987); and fast spin echo pulse sequences (FSE, RARE) described by J. Hennig et al. (*Magnetic Resonance In Medicine*, 3, 823–833, 1986) can be used with the contrast preparation of the present invention.

Referring still to FIG. 4, the preparatory pulse sequence of the present invention includes a 180° RF inversion pulse which is produced at a time interval TI before the start of the imaging pulse sequence. While this inversion recovery interval TI can be fine tuned to the particular anatomy being imaged, an interval of approximately 150 msecs works well when imaging the human breast.

Incorporated with the inversion recovery contrast preparation is an off-resonance spin-lock contrast preparation. This is achieved by applying a first off-resonance spin-lock RF pulse 61 and a second off-resonance spin-lock RF pulse 62. Both RF pulses 61 and 62 have the same amplitude which is set to produce about 0.025 gauss, or about one quarter the amplitude of the 90° RF excitation pulse 50. The resonant frequency offset of the spin lock pulse can be fine tuned to achieve the desired contrast effect. For the human breast, the resonant frequency offset of the spin lock pulse is about 100 Hz. The duration ($TSL_2$) of the second spin-lock RF pulse 62 is constrained by the boundaries set by the inversion recovery period TI, and has a value from 120 to 130 msecs. when imaging the human breast. The duration ($TSL_1$) of the first spin-lock RF pulse 61 may be longer and a value of 200 msecs. is employed in the preferred embodiment. Contrast enhancement can be achieved with both spin-lock pulses 61 and 62 applied, or with only one of them applied. For example, when a multi-slice scan is being performed and SAR limits are a concern, only the first spin-lock RF pulse 61 need be applied. These pulses 61 and 62 are non-selective and therefore affect the spins in all slices simultaneously.

As with a conventional inversion recovery preparation sequence, gradient spoiler pulses 63 and 64 may be applied after each spin-lock RF pulse 61 and 62. These spoiler gradients dephase any transverse magnetization that may be produced during the intervals $TSL_1$ and $TSL_2$ and which might otherwise produce image artifacts.

I claim:

1. A method for producing an NMR image, the steps comprising:
   a) applying a polarizing magnetic field to spins located in a region of interest to produce precession in a selected spin species at a Larmor frequency $f_o$;
   b) applying a 180° RF inversion field pulse to the spins in the region of interest which is tuned to the Larmor frequency $f_o$;
   c) applying an RF spin-lock field pulse having an amplitude of $f_1$ to the spins in the region of interest, said RF spin-lock field pulse being tuned to a frequency which is offset by an amount $\Delta$ from the Larmor frequency $f_o$;
   d) executing an imaging pulse sequence to acquire an NMR signal by applying an RF excitation field pulse to the spins in the region of interest at a time interval TI following the application of the 180° RF inversion field pulse and which is tuned to the Larmor frequency $f_o$; and
   e) reconstructing an image using the acquired NMR signal.

2. The method as recited in claim 1 in which the RF spin-lock field pulse is applied during the interval TI.

3. The method as recited in claim 2 in which a magnetic field gradient pulse is applied to the spins in the region of interest following the application of said RF spin-lock field pulse and prior to the execution of said imaging pulse sequence.

4. The method as recited in claim 1 in which the RF spin-lock field pulse is applied before the application of said 180° RF inversion field pulse.

5. The method as recited in claim 4 in which a magnetic field gradient pulse is applied to the spins in the region of interest following the application of said RF spin-lock field pulse and prior to the execution of said imaging pulse sequence.

6. The method as recited in claim 4 in which a second RF spin-lock field pulse is applied to the spins in the region of interest during the interval TI, said second RF spin-lock field pulse being tuned to a frequency which is offset by an amount $\Delta$ from the Larmor frequency $f_o$.

7. The method as recited in claim 6 in which magnetic field gradient pulses are applied to the spins in the region of interest after the application of each of said RF spin-lock field pulses.

8. The method as recited in claim 1 in which the offset frequency $\Delta$ and amplitude $f_1$ of the RF spin-lock field pulse and the interval TI are selected to suppress NMR signals produced by spins associated with two types of tissue relative to NMR signals produced by spins associated with a third type of tissue.

* * * * *